(12) United States Patent
Chapman et al.

(10) Patent No.: US 7,211,326 B2
(45) Date of Patent: May 1, 2007

(54) CARBON MATERIAL AND PROCESS OF MANUFACTURING

(75) Inventors: Lloyd R. Chapman, Knoxville, TN (US); Cressie E. Holcombe, Jr., Knoxville, TN (US)

(73) Assignee: Equity Enterprises, Knoxville, TN (US)

( * ) Notice: Subject to any disclaimer, the term of this patent is extended or adjusted under 35 U.S.C. 154(b) by 35 days.

(21) Appl. No.: 10/919,905

(22) Filed: Aug. 17, 2004

(65) Prior Publication Data

US 2005/0019579 A1 Jan. 27, 2005

Related U.S. Application Data

(63) Continuation of application No. 10/348,050, filed on Jan. 21, 2003, now Pat. No. 6,830,812.

(51) Int. Cl.
 *B32B 9/00* (2006.01)
(52) U.S. Cl. ..................................... 428/408
(58) Field of Classification Search ............... 428/308, 428/323; 423/445 R; 427/448
 See application file for complete search history.

(56) References Cited

U.S. PATENT DOCUMENTS

| | | | |
|---|---|---|---|
| 3,914,508 A | 10/1975 | Hooton et al. .............. 428/408 |
| 4,863,649 A | 9/1989 | Kawakubo et al. ......... 264/29.6 |
| 4,892,790 A | 1/1990 | Gray ........................... 428/548 |
| 5,071,797 A | 12/1991 | Hida ............................ 501/87 |
| 5,090,969 A | 2/1992 | Oki et al. ..................... 51/295 |
| 5,230,718 A | 7/1993 | Oki et al. ..................... 51/293 |
| 5,277,973 A | 1/1994 | Yamamura et al. .......... 428/367 |
| 5,286,565 A | 2/1994 | Holzl et al. .................. 428/408 |
| 5,294,382 A | 3/1994 | Goldberger ................... 264/27 |
| 5,298,311 A | 3/1994 | Bentson et al. .............. 428/216 |
| 5,304,397 A | 4/1994 | Holzl et al. .................. 427/249 |
| 5,330,838 A | 7/1994 | Dyer et al. ................... 428/408 |
| 5,368,938 A | 11/1994 | Holzl et al. .................. 428/408 |
| 5,676,723 A | 10/1997 | Taniguchi et al. ............ 65/286 |
| 6,194,650 B1 | 2/2001 | Wakayama et al. ......... 136/256 |
| 6,404,982 B1 * | 6/2002 | Mariner et al. .............. 392/389 |

* cited by examiner

*Primary Examiner*—Jennifer McNeil
*Assistant Examiner*—Daniel Miller
(74) *Attorney, Agent, or Firm*—Joseph T. Guy; Nexsen Pruet, LLC

(57) ABSTRACT

A carbon material is formed by heat-treating a carbonaceous material in a reaction mix of boron oxide or its precursors and ammonia-generating phases such as melamine or its like in a nitrogen atmosphere to temperatures of 1600 to 2000° C. The surface of the carbonaceous material is transformed into a carbon material that is resistant to oxidation to temperatures of 900° C., enabling machined components to be utilized for weeks at that temperature. The carbon material also is stable in inert or vacuum environments to temperatures in the range of 1500 to 2000° C., enabling its use as aluminum evaporative boats and the like.

16 Claims, No Drawings

CARBON MATERIAL AND PROCESS OF MANUFACTURING

CROSS-REFERENCE TO RELATED APPLICATION

This invention is a continuation of U.S. patent application Ser. No. 10/348,050 filed Jan. 21, 2003 now U.S. Pat. No. 6,830,812.

BACKGROUND OF THE INVENTION

This invention relates generally to carbonaceous materials that have enhanced properties. More particularly, the present invention is related to carbon material that is made oxidation resistant to temperatures of 900° C. The oxidation resistant carbon materials have an electrically non-conducting surface with significantly enhanced surface hardness.

Carbonaceous materials, such as carbon, graphite, carbon-carbon composites, glassy carbon, and the like have many uses. In particular they are useful at high-temperatures where they have excellent mechanical strength. The oxidation of carbonaceous materials in air or oxygen-containing environments at temperatures of 400 to 500° C. has limited its use in high-temperature applications. Otherwise, the easy machinability, low density, good strength, and other properties would lead to carbonaceous materials being the obvious choice.

Oxidation protection of carbonaceous materials has been directed to coatings and layers that are utilized to reduce the reaction of oxygen with the materials. Exemplary teachings are provided in U.S. Pat. Nos. 4,711,666 and 4,769,074. Often such layers contain silicon or aluminum to help form glasslike coatings during oxygen attack, whereby the glassy layer or glaze will reduce any additional oxidation of the substrate. An inherent concern with coatings is the thermal expansion mismatches between the substrate and coating that often cause delamination and complete coating spallation.

Another example of oxidation improvement for carbonaceous materials is U.S. Pat. No. 5,368,938, herein described is the reaction of carbon with gaseous boron oxide to form boron carbide. Still another method of oxidation protection for carbonaceous materials, described in U.S. Pat. No. 5,356,727, is based on "boron carbonitride" designated as CBN, or CBNO if it contains oxygen. CBN is produced by chemical vapor deposition at 700° C. with a mixture of hydrocarbons, boron trichloride and ammonia along with nitrogen or hydrogen carriers at a low as a small fraction of atmospheric pressure, such as a few hundred to a few thousand pascals. The CBN, as described therein, typically has a "metallic appearance" at 50 micrometers thickness.

Graphite has been coated with "pyrolytic boron nitride" to form boats for metal vaporization, as described in U.S. Pat. No. 4,264,803. In such cases, the boron nitride coating was deposited at 1750 to 2300° C. to a thickness of about 250 micrometers or 0.010 inches. It was found that the geometry of the boat cavity and nearly total encapsulation of the boat held the coating onto the substrate. The tendency of the coating of "pyrolytic boron nitride" to delaminate seems to be the main problem with this type of boat.

None of the known technologies for improving the oxidation resistance of carbonaceous materials produces a carbon material that is not a coated surface. Integral materials have been heretofore been thought to be difficult to prepare due to the differences in crystal lattice between dissimilar materials. Any blending of materials would generate a unique crystalline lattice which is dissimilar from either starting material. This typically leads to crystallographic defects and dislocations which can create additional, often uncontrollable and unpredictable, crystallographic phases.

BRIEF SUMMARY OF THE INVENTION

A particular feature of the present invention is the ability to form carbonaceous materials with a hardened exterior that is non-conducting.

Another feature is the ability to form a relatively soft carbonaceous item in a desired shape and configuration after which the item can be treated to form an oxidative resistant hard surface without altering the dimensions or structural components of the carbonaceous item.

These and other advantages, as would be realised to one of ordinary skill in the art, are provided in a carbon material produced by heating a carbonaceous material embedded in a boron nitride precursor.

Another embodiment is provided in a process for manufacturing a carbon material that has enhanced oxidation resistance and an electrically non-conducting surface. The process involves the steps of embedding a carbonaceous material in a boron nitride precursor and heating the embedded carbonaceous material to a temperature in the range of from about 1600° C. to about 2000° C. at one atmosphere pressure with flowing nitrogen.

Yet another embodiment is provided in a surface hardened carbonaceous tool prepared by a process comprising machining a carbonaceous blank into a tool precursor, embedding the tool precursor in a boron nitride precursor to form an envelope and heating the envelope to a temperature of 1600 to 2000° C. at one atmosphere of flowing nitrogen to form the carbonaceous tool.

DETAILED DESCRIPTION OF THE INVENTION

The inventors of the present application have developed, through diligent research, a process for forming an integral oxidation resistance region on the exterior of the carbon and the material formed thereby.

Essential to this invention is a means of heat-treating carbonaceous materials in a boron nitride production process. Boron nitride production processes are well known in the art, typically involving reaction of boric acid, borates, or boron oxides or the like with ammonia gas or with nitrogen containing compounds such as melamine, urea, dicyandiamide etc. that yield ammonia during heating in nitrogen atmosphere. These processes have been referred to in U.S. Pat. Nos. 4,562,050; 4,784,978; 4,749,556; 5,854,155. A filler, such as calcium phosphate, may be used, as well as additives such as carbon or boron to affect final purity of the boron nitride powder. However, these processes all involve heating to temperatures of around 1000° C. to produce a "turbostratic" boron nitride that then requires further heating to temperatures of 1600 to 2200° C. to obtain good crystallinity and to reduce residual boron oxide.

The present invention provides a new carbon material. This carbon material is likely a composition of B—N—O—C, resulting from the reaction of those phases present during boron nitride production with the carbonaceous material buried in the reaction mixture. The type of carbonaceous material can be carbon, carbon-carbon composite, glassy carbon, any type of graphite, or virtually any type of carbon material. The interaction of the reactive products of boron nitride precursors, such boron oxides and ammonia or melamine, typically results in incompletely reacted boron nitride that contains considerable oxygen and has varied stoichiometry and crystallinity along with unreacted boron oxide. In the presence of nitrogen, boron carbide does not form. Boron oxides vaporize at temperatures above 1300° C. By heat-treating the carbonaceous material in the reaction mixtures used for making boron nitride, a carbon material is produced with visually the same dimensions and no weight changes from its initial condition. The surface is light grayish-white in appearance. Machined dimensions are retained. Yet the initial carbonaceous material transforms into a distinctly different carbon material, with superior oxidation resistance and an electrically non-conductive surface. The final material is uniquely produced at one atmosphere pressure with flowing nitrogen.

According to the present invention, a new carbon material is provided that has many advantages over the prior art. The new carbon material exhibits almost no reaction with air to temperatures of 900° C. for many days. The material is distinctly not a coating but an integral surface treatment that is married to the substrate whereby the dimensions are essentially unchanged from their initial dimensions. Any carbonaceous material can be heat-treated in a standard boron nitride powder production process mixture in the presence of nitrogen gas at one atmosphere pressure. The converted surface has an affected depth of about 200 micrometers whereas the first 100 micrometers seem to have mostly changed. Visually the surface is light grayish-black.

The procedure is similar to metal heat-treating. Any shaped part or component of a carbonaceous material is placed in a powder mixture that is a precursor material for boron nitride. For example, boric acid is normally blended with melamine in a ratio of 2.5 pounds of melamine to 3.5 pounds of boric acid. The carbonaceous material is placed into the mixture so that it is completely covered with the mixture. A graphite boat or container is used to hold this material. Typically, it is heated from room temperature up to 1000° C. for approximately 2 hours immediately followed by heating to 1900° C. for 2 hours. During this period of heating in a nitrogen atmosphere, gases evolve. The gases are mostly ammonia but also include water, carbon monoxide, carbon dioxide, hydrogen, hydrogen cyanide, boron oxide(s), and other species.

The precursor material for boron nitride comprises a boron compound and a nitriding compound which, when heated together, react to form boron nitride. Preferred boron compounds include boric acid, borates, borax, boron oxides, orthoboric acid, metaboric acid, tetraboric acid, lithium borate, potassium borate, sodium perborate, boron trichloride and ammonium borate. It is most preferred that the boron compound be solid. Boron oxides are particularly preferred as the boron compound.

Preferred nitriding compounds include ammonia gas, ammonium chloride, urea, melamine, melam, melem, melon, dicyandiamide, ammelide, guanamines such as acetoguanamine, and nitrogen-compound containing salts such as guanidine hydrochloride, melamine hydrochloride, melamine phosphate or malamine oxalate. Melamine is a particularly preferred nitriding compound.

For graphite parts subjected to the above procedure, weight changes are minimal as are any visual changes in dimensions. Edge retention and shape retention are excellent. Graphite parts have been tested in an air furnace for oxidation to 10% weight loss. This is a standard measurement used to compare effectiveness with graphite oxidation improvements. Oxidation was essentially stopped at 750° C., with no observable weight change after 400 to 500 hours. At 900° C., weight loss reached 10% after 18 to 20 days.

By post-heating in air for 1000° C. for 1 hour up to 24 hours or so and then testing the oxidation at lower temperatures, such as 750° C., the oxidation resistance is enhanced. At 750° C., the time to reach 10% weight loss was approximately 2000 hours or 80 to 90 days.

Testing of the heat-treated carbon material in vacuum at 1500° C. showed no weight, dimensional, or visual changes. The surface remained electrically nonconductive in all cases.

The surface of the new carbon material is not soluble in water or methyl alcohol. While not restricted to any theory regarding the actual chemical composition of the surface and immediate interior the insolubility indicates that the inventive phase is different chemically from boron oxide/boric acid phases. The lack of vaporization at 1500° C. also indicates significant differences from boron-oxygen compounds. The oxidation stability in air greatly exceeds boron nitride. The visual appearance suggests that the new carbon material is probably likely a composition of B—N—O—C, which results from the reaction of those phases present in the boron nitride production processes reacting with the carbonaceous material that is buried in the reaction mixture.

Any type of carbonaceous material is similarly affected, whether it is carbon, carbon-carbon composite, glassy carbon, carbon or graphite felt, flexible graphite foil (grafoil) such as described in U.S. Pat. No. 3,404,061, or any type of graphite. It appears that the reactive phases from boron nitride production processes react with carbon to produce a carbon material that is unique and not yet characterized herein. The many phases of boron-nitrogen-oxygen-carbon that can be present in liquid, vapor, or gaseous states prohibit the determination of the mechanism of the production of this new carbon material. Since boron carbide does not form in the nitrogen atmosphere that is used for boron nitride production processes, that may drive the composition towards a boron-nitride-like phase. This would account for the observed light grayish-white color, definitely not metallic appearing. Visually, there is no change in the outer dimensions or shape which suggest, without limiting the scope herein, some type of substitution reaction within the crystal lattice of the carbon. Even screw threads are not affected by the heat-treatment and transformation to the new carbon material. The final carbon material does not act in any way like a coated part.

The observed properties of this new carbon material greatly enhance the potential utility of carbonaceous materials. The surface created with this invention is like a "deep-case" treatment for metals, where the treated surface is integrally bonded to the substrate, essentially married to the substrate and not acting as an independent layer or coating. The underlying carbon has the properties of normal carbon and thus has electrical conductivity that is characteristic of whatever species of carbon is utilized, enabling both electrically conductive and nonconductive surfaces to be available. The affected surface region from the heat-treatment is electrically nonconductive, but that layer can be machined down to leave material that has the characteristics of the un-heat-treated substrate carbonaceous material. For graphite, the substrate is highly electrically conductive.

It should be noted that the affected surface is much harder than normal graphite or carbon materials or normal hexagonal boron nitride. The surface is easily ground down with silicon carbide wheels, thus indicating it to be softer than silicon carbide.

Graphite electrodes used for steelmaking have significant consumption due to surface oxidation. This can be prevented with the carbon material of this invention. Electrical conductivity can be achieved by clamps that penetrate the surface to achieve electrical contact with the underlying electrically conductive graphite substrate which remains chemically unaltered in the present process.

Evaporation boats can be made that are usable in vacuum conditions to 1500° C. and above due to the stability of the surface of this carbon material. There are no problems with delamination since the surface is tightly bonded to the substrate, essentially as if there is no coating but just an extension of the material. Areas needing electrical conductivity, such as where clamping is desired, can be made electrically conductive by machining away the electrically nonconductive affected surface region to expose the electrically conductive graphite substrate.

For electrical-discharge machining (EDM) electrodes used for hole-drilling, the sides need to be electrically nonconductive while the cutting surface needs to be electrically conductive. This is also achieved by machining away the electrically nonconductive affected surface region to expose the electrically conductive graphite substrate.

For greatly extended life, pump components, injection tubes, paddles, stalk tubes, etc. used for nonferrous metal melting and casting can be made of this new carbon material. The enhanced oxidation resistance, hardness, and electrical nonconduction of the affected surface provide new usefulness for carbonaceous materials.

A flash evaporator was prepared in accordance with the invention described herein. The heating cycle was about 2 hours at 950° C. and about 2 hours at about 1900° C. The flash evaporator was cross-sectioned for visible inspection. The visible appearance indicated that the chemical transformation was about 200 to 300 micrometers into the carbon. Increasing the time, temperature and exposure is expected to increase the thickness of the converted layer.

A graphite sample was embedded in melamine and borix acid mix. The coupon was heated to 950° C. for 2 hours. The resulting product oxidized like normal graphite indicating that the reaction did not occur under these conditions.

Braided graphite, available as braided flexible graphite packing, was treated in accordance with the present invention. The material became less flexible yet the shape and appearance were substantially unchanged. Oxidation properties were consistent with the present invention.

A sample of 0.1 to 0.125 thick piece of grafoil was treated in accordance with the present invention. The oxidation properties were improved without loss of shape or size.

While preferred embodiments have been shown and described, it will be understood that it is not intended to limit the disclosure, but rather it is intended to cover all modifications and alternate methods falling within the spirit and the scope of the invention as defined in the appended claims.

The invention has been described with particular emphasis on the preferred embodiments. It would be realized from the teachings herein that other embodiments, alterations, and configurations could be employed without departing from the scope of the invention which is more specifically set forth in the claims which are appended hereto.

The invention claimed is:

1. A carbon material produced by heating a carbonaceous material embedded in a boron nitride precursor comprising a boron compound and a nitriding compound wherein said boron nitride precursor comprises melamine.

2. The carbon material of claim 1 wherein the carbonaceous material is selected from graphite, carbon, carbon-carbon composite, glassy carbon, carbon felt, graphite felt, or grafoil.

3. The carbon material of claim 1 wherein said boron nitride precursor comprises at least one compound selected from boric acid, borate, boron oxides, borax, orthoboric acid, metaboric acid, tetraboric acid, lithium borate, potassium borate, sodium perborate, boron trichloride and ammonium borate.

4. The carbon material of claim 3 wherein said boron nitride precursor comprises at least one compound selected from boric acid, borate, boron oxides and borax.

5. The carbon material of claim 1 wherein said heating is done in a flowing nitrogen atmosphere.

6. The carbon material of claim 1 wherein said carbon material is a part with a carbon interior and an oxidation resistant exterior.

7. The carbon material of claim 6 wherein said part is a graphite electrode.

8. The carbon material of claim 6 wherein said part is an electrical-discharge machining electrode.

9. The carbon material of claim 6 wherein said part is an evaporative boat.

10. A surface hardened carbonaceous tool prepared by a process comprising:
    machining a carbonaceous blank into a tool precursor;
    embedding said tool precursor in a boron nitride precursor comprising a boron compound and a nitriding compound to form an envelope; and
    heating said envelope to a temperature of from 1600 to 2000° C. at one atmosphere of flowing nitrogen to form said carbonaceous tool wherein said boron nitride precursor comprises a boron compound and a nitrogen containing compound capable of producing ammonia during heating wherein said boron nitride precursor comprises melamine.

11. The surface hardened carbonaceous tool of claim 10 wherein said boron nitride precursor comprises at least one compound selected from boric acid, borate, boron oxide, borax, orthoboric acid, metaboric acid, tetraboric acid, lithium borate, potassium borate, sodium perborate, boron trichloride and ammonium borate.

12. The surface hardened carbonaceous tool of claim 11 wherein said boron nitride precursor comprises at least one compound selected from boric acid, borate, boron oxide and borax.

13. The surface hardened carbonaceous tool of claim 10 wherein said tool is a graphite electrode.

14. The surface hardened carbonaceous tool of claim 10 wherein said tool is an electrical-discharge machining electrode.

15. The surface hardened carbonaceous tool of claim 10 wherein said tool is an evaporative boat.

16. The surface hardened carbonaceous tool of claim 10 further comprising post heating said carbonaceous tool at a temperature of at least about 1000° C.

* * * * *